(12) United States Patent
Bhatia et al.

(10) Patent No.: US 8,885,393 B2
(45) Date of Patent: Nov. 11, 2014

(54) MEMORY ARRAY VOLTAGE SOURCE CONTROLLER FOR RETENTION AND WRITE ASSIST

(71) Applicant: Apple Inc., Cupertino, CA (US)

(72) Inventors: Ajay Bhatia, Saratoga, CA (US); Hang Huang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/717,870

(22) Filed: Dec. 18, 2012

(65) Prior Publication Data

US 2014/0169075 A1    Jun. 19, 2014

(51) Int. Cl.
*G11C 11/00* (2006.01)
*G11C 7/00* (2006.01)
*G11C 5/14* (2006.01)

(52) U.S. Cl.
CPC *G11C 5/147* (2013.01); *G11C 7/00* (2013.01); *G11C 11/00* (2013.01)
USPC . 365/154; 365/49.11; 365/188; 365/189.011; 365/189.02; 365/190; 365/202; 365/226; 365/228; 365/229

(58) Field of Classification Search
USPC .......... 365/49.11, 154, 188, 189.011, 189.02, 365/190, 202, 226, 228, 229
See application file for complete search history.

(56) References Cited

U.S. PATENT DOCUMENTS

| 7,596,012 | B1* | 9/2009 | Su et al. ................... 365/154 |
| 7,692,976 | B2 | 4/2010 | Cheng et al. |
| 8,310,894 | B1 | 11/2012 | Su et al. |
| 2009/0268536 | A1 | 10/2009 | Park |
| 2012/0008377 | A1 | 1/2012 | Chuang et al. |
| 2013/0283069 | A1* | 10/2013 | Matsuda ................... 713/300 |

FOREIGN PATENT DOCUMENTS

JP    WO2012086072    *    6/2012

* cited by examiner

*Primary Examiner* — Fernando Hidalgo
(74) *Attorney, Agent, or Firm* — Meyertons, Hood, Kivlin, Kowert & Goetzel, P.C.

(57) ABSTRACT

A voltage source controller for a memory array includes an input coupled to a voltage source, an output coupled to one or more memory cells of a memory array, where the output is configured to provide a cell source voltage to the memory cells. The controller also includes a switch circuit configured to: receive a retention enable signal, a write assist enable signal, and a standard mode enable signal; and based on the retention enable signal, write assist enable signal, and standard mode enable signal, selectively set the cell source voltage for one or more of the memory cells to one of: a retention voltage, a write assist voltage, or a standard mode voltage, where the retention voltage and the write assist voltage are less than the standard mode voltage.

25 Claims, 7 Drawing Sheets

MEMORY ARRAY VOLTAGE SOURCE CONTROLLER FOR RETENTION AND WRITE ASSIST

BACKGROUND

1. Technical Field

This disclosure relates generally to integrated circuit layouts and design, and more particularly to voltage source controllers, devices, and methods for controlling voltage of memory cells.

2. Description of the Related Art

In recent years, mobile devices such as smart phones and tablet computers have become increasingly sophisticated. In addition to supporting telephone calls, many mobile devices now provide access to the internet, email, text messaging, and navigation using the global positioning system (GPS). Mobile devices that support such sophisticated functionality often include many components. To remain mobile, physical size of such components of a mobile device is a design concern. Further, many mobile devices operate on battery power. Reducing power consumption of components of a mobile device, therefore, is also a design concern.

Computer memory technologies have improved in reducing power consumption. Memory arrays, for example, are often operated in various low-power modes, such as a retention mode and a write assist mode. In the retention mode, core operating power of memory cells of the memory array may be reduced to a minimum voltage that enables the data stored within the cell to remain. Lowering the voltage below such a minimum voltage may cause the data to be lost. In the write assist mode, voltage to a memory cell may be reduced such that writing a bit to a memory cell requires less power.

In memory arrays of the prior art, separate hardware is utilized to effect the retention mode and the write assist mode. That is, one set of hardware is utilized to effect the retention mode while another, different set of hardware is utilized to effect the write assist mode. Each set of hardware correspondingly requires its own area on a chip or in a device.

SUMMARY

Various example voltage source controllers, devices including such voltage source controllers, processors including memory arrays having source voltages controlled by such voltage source controllers, and methods for operating memory with such voltage source controllers are disclosed. One example voltage source controller includes an input coupled to a voltage source and an output coupled to one or more memory cells of a memory array, where the output configured to provide a cell source voltage to the memory cells. The voltage source controller may also include a switch circuit configured to: receive a retention enable signal, a write assist enable signal, and a standard mode enable signal; and based on the retention enable signal, write assist enable signal, and standard mode enable signal, selectively set the cell source voltage for one or more of the memory cells to one of: a retention voltage, a write assist voltage, or a standard mode voltage. The retention voltage and the write assist voltage are less than the standard mode voltage.

One example device, such as a mobile device, includes a memory array and a voltage source controller. The memory array may include a number of memory cells and one or more of the memory cells are configured to receive a cell source voltage from the voltage source controller. The voltage source controller may be configured as the example voltage source controller described above.

One example processor includes a cache memory including a number of memory cells and a voltage source controller. One or more of the memory cells may be configured to receive cell source voltage from the voltage source controller. The voltage source controller may be configured as the example voltage source controller described above.

One example method of operating a voltage source controller similar to the example voltage source controller described above includes receiving, by the voltage source controller, one or more enable signals. Responsive to receiving the one or more enable signals, the method may also include selectively setting, by the voltage source controller, the source cell voltage for one or more of the memory cells to one of: a retention voltage, a write assist voltage, or a standard mode voltage. In such an embodiment, the retention voltage and the write assist voltage are less than the standard mode voltage.

Figure 1:
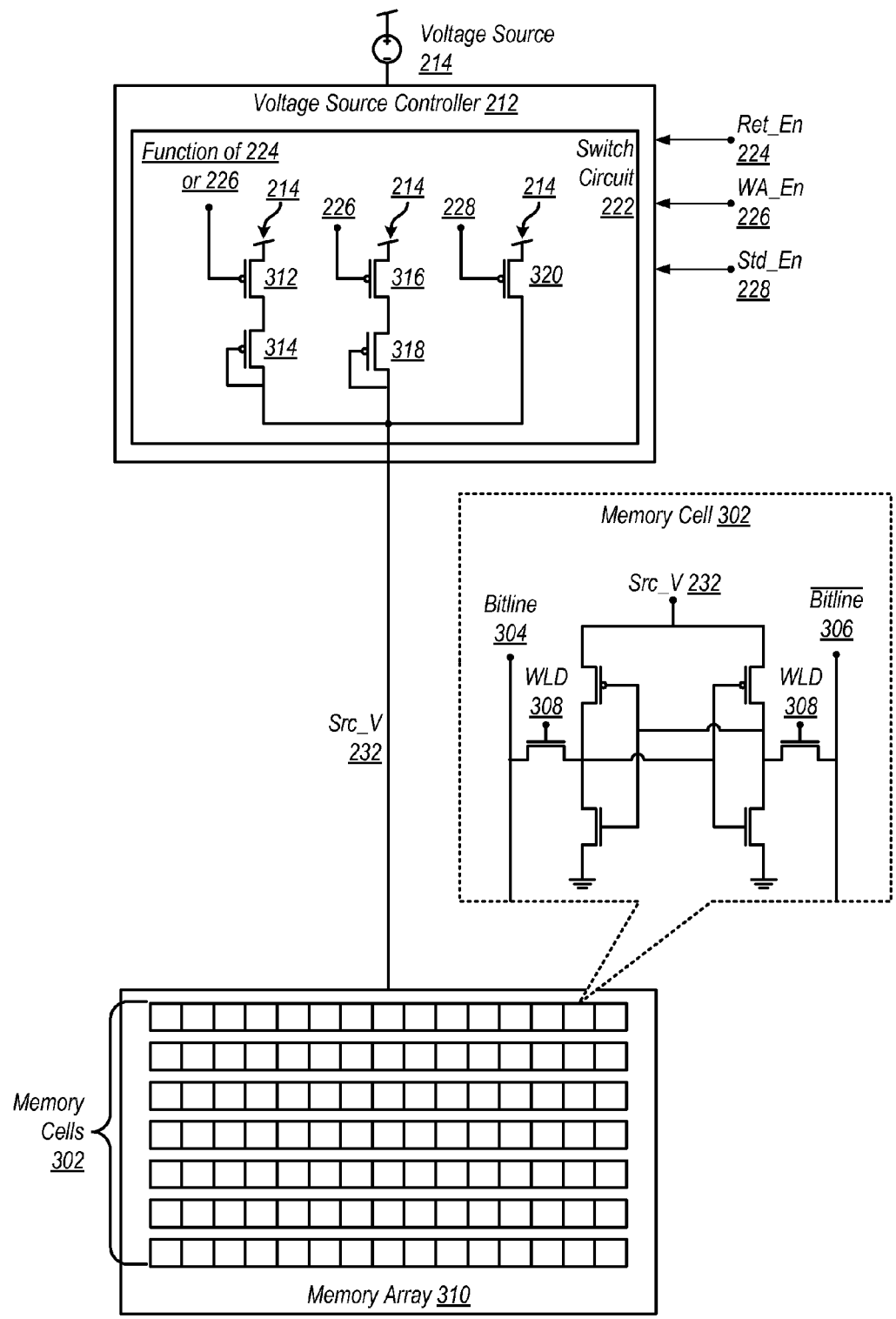
FIG. 1 sets forth a block diagram of one embodiment of a wireless communication system.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

FIG. 1 sets forth a block diagram of one embodiment of a wireless communication system. The system of FIG. 1 is one example of any of a variety of wireless communication systems. The wireless communication system 10 includes a base station 102 which communicates over a wireless transmission medium such as, for example, an over the air interface with one or more user equipment (UE) devices, 106A through 106N. The base station 102 is also coupled a network 100 via another interface, which may be wired or wireless. Components identified by reference designators that include both a number and a letter may be referred to by the only a number where appropriate.

The base station 102 may be a base transceiver station (BTS) or cell site, and may include hardware that enables wireless communication with one or more of the UEs 106. The base station 102 may also be equipped to communicate with the network 100. Thus, the base station 102 may facilitate communication between the UEs 106 and/or between the UEs 106 and the network 100. The communication area (or coverage area) of the base station 102 may be referred to as a "cell." In various embodiments, the base station 102 and the UEs may be configured to communicate over the transmission medium using any of various wireless communication radio access technologies such as LTE, eHRPD, GSM, CDMA, WLL, WAN, WiFi, WiMAX, etc. In embodiments that communicate using the eHRPD standard, the BTS 102 may be referred to as an HRPD BTS, and the network 100 may include an eAN/ePCF and a number of gateways including HRPD gateway (HSGW), a PDN gateway (P-GW), and a number of policy and packet control functions that may be associated with a service provider, for example.

In one embodiment, each of the UEs 106A-106N may be representative of a device with wireless network connectivity such as a mobile phone, a hand-held device, a computer or a tablet, or virtually any type of wireless device. As described further below, the UE 106 may include at least one processor that is configured to execute program instructions stored in a memory. Accordingly, in some embodiments, the UE 106 may perform one or more portions of the functionality described below by executing such stored instructions. However, in other embodiments, the UE 106 may include one or more hardware elements and/or one or more programmable hardware elements such as an FPGA (field-programmable gate array) that may be configured to perform the one or more portions the functionality described below. In still other embodiments, any combination of hardware and software may be implemented to perform the functionality described below.

In the system 10 of FIG. 1, any of the UEs 106 may include, among other components, a memory array and a voltage source controller. In such an example, the memory array may include a number of memory cells and one or more of the memory cells may be configured to receive a cell source voltage from the voltage source controller. The cell source voltage, as the term is used here, refers to an operational voltage, Vdd for example, for a memory cell. Such an operational voltage may be varied in order to operate a memory cell—and thereby the memory array as a whole—in various low-power modes. One mode, called a retention mode, enables memory cells to operate a reduced cell source voltage, while maintaining the data stored in the memory cells. In some embodiments, such a reduced cell source voltage may be configured as a minimum threshold voltage such that reducing the cell source voltage lower than the minimum may result in loss of data. Another low-power mode in which memory cells may be operated is referred to as a write assist mode. In the write assist mode, the cell source voltage is reduced such that the power required to write data to a memory cell ('flip a bit') is reduced.

In the example system 10 of FIG. 1, rather than utilizing multiple different sets of hardware to effect the various low-power modes, a single voltage source controller of a UE 106 may be configured to vary the cell source voltage of one or more memory cells for retention, write assist, and a standard mode. Such a voltage source controller may include an input coupled to a voltage source and an output configured to provide the cell source voltage to the memory cells. The voltage source controller may also include a switch circuit that is configured to receive a retention enable signal, a write assist enable signal, and a standard mode enable signal. Based on the retention enable signal, write assist enable signal, and standard mode enable signal, the switch circuit may selectively set the cell source voltage for one or more of the memory cells to one of: a retention voltage, a write assist voltage, or a standard mode voltage. In such an embodiment, the retention voltage and the write assist voltage are less than the standard mode voltage. An examples retention voltage may include approximately 600 mV, an example write assist voltage may include approximately 700 mV, and an example standard mode voltage may include 900 mV.

Figure 2:
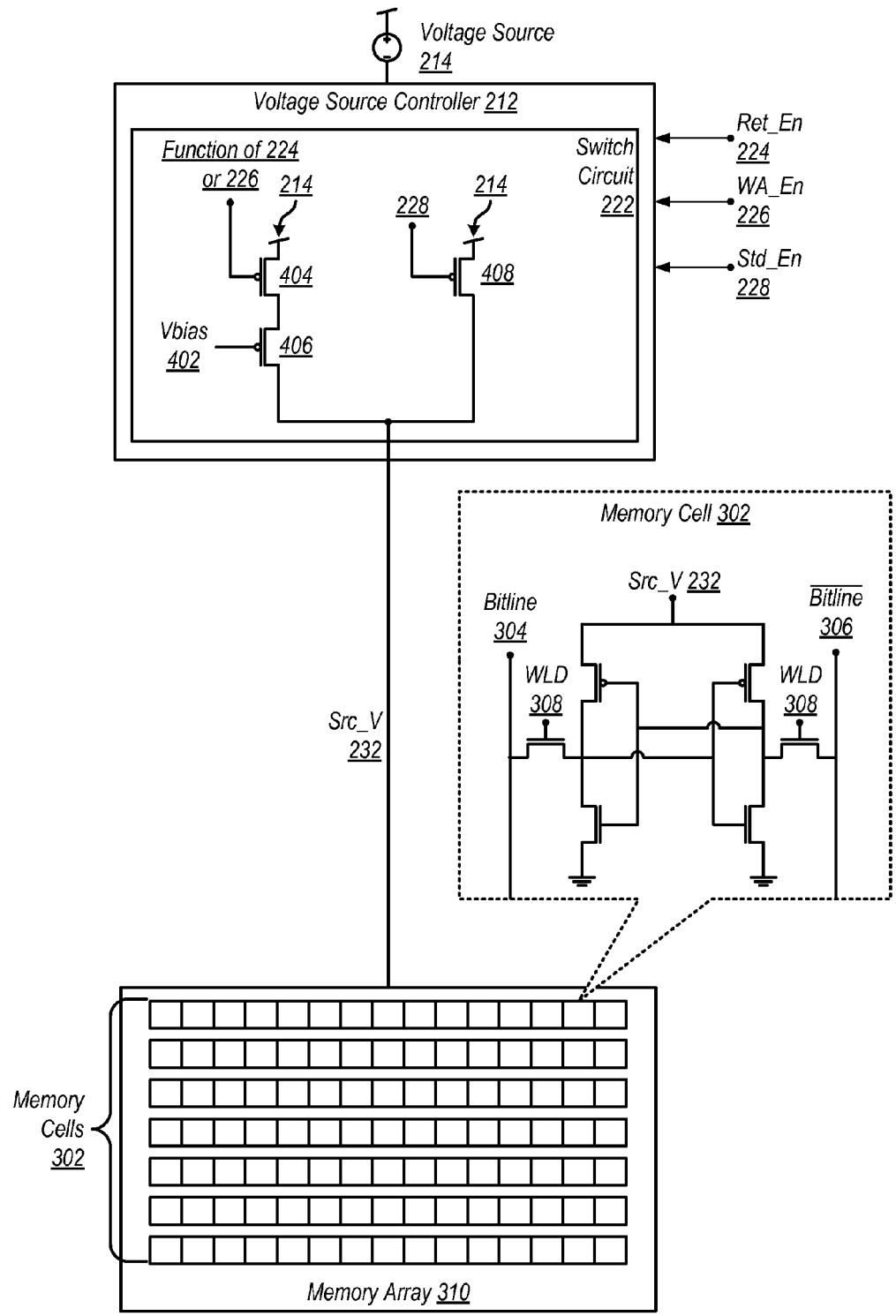
FIG. 2 sets forth a block diagram of one embodiment of a wireless communication device shown in FIG. 1.

For further explanation, FIG. 2 sets forth a block diagram of one embodiment of a wireless communication device shown in FIG. 1. The UE 106 includes one or more processors 202 (or one or more processor cores 202) which are coupled to display circuitry 204 which is in turn coupled to the display 240. The display circuitry 204 may be configured to perform graphics processing and provide display signals to the display 240.

The one or more processors 202 are also coupled to a memory management unit (MMU) 220 and to a receiver/transmitter (R/T) unit 230. The MMU 220 is coupled to a memory 206. The UE 106 also includes an I/O interface 210 that is coupled to the processor(s) 202, and may be used for coupling the UE 106 to a computer system, or other external device. It is noted that in one embodiment the components shown within UE 106 of FIG. 2 may be manufactured as standalone components. In other embodiments, however, various ones of the components may be part of one or more chipsets or part of a system on chip (SOC) implementation.

In various embodiments, the processors 202 may be representative of a number of different types of processors that may be found in a wireless communication device. For example, the processors 202 may include general processing capability, digital signal processing capability, as well as hardware accelerator functionality, as desired. The processors 202 may include baseband processing and therefore may digitally process the signals received by the R/T unit 230. The processors 202 may also process data that may be transmitted by the R/T unit 230. The processors 202 may also perform a number of other data processing functions such as running an operating system and user applications for the UE 106.

In one embodiment, the MMU 220 may be configured to receive addresses from the one or more processors 202 and to translate those addresses to locations in memory (e.g., memory 206) and/or to other circuits or devices, such as the display circuitry 204, R/T unit 230, and/or display 240. The MMU 220 may also return data to one or more of the processors 202 from the locations in memory 206. The MMU 220 may be configured to perform memory protection and page table translation or set up. In some embodiments, the MMU 220 may be included as a portion of one or more of the processors 202.

The R/T unit 230 may, in one embodiment, include analog radio frequency (RF) circuitry for receiving and transmitting RF signals via the antenna 235 to perform the wireless communication. The R/T unit 230 may also include down-conversion circuitry to lower the incoming RF signals to the baseband or intermediate frequency (IF) as desired. For example, the R/T unit 230 may include various RF and IF filters, local oscillators, mixers, and the like. Since the UE 106 may operate according to a number of radio access technologies, the R/T unit 230 may include a corresponding number of RF front end portions to receive and down-convert, as well as up-convert and transmit the respective RF signals of each technology.

In some embodiments, the processor 202 may include a cache memory 218. Such a cache memory 218 includes a number of memory cells. Cache memory may be implemented in a variety of forms, such as, for example, Static Random Access Memory ('SRAM').

In addition to the cache 218, the example processor 202 may also include a voltage source controller 212, where one or more of the memory cells of the cache 218 are configured to receive a cell source voltage 232 from the voltage source controller 212. The voltage source controller 212 in the example processor 202 of FIG. 2 may include an input coupled to a voltage source 214 and an output configured to provide the cell source voltage 232 to the memory cells.

The voltage source controller may also include a switch circuit 222 that is configured to receive a retention enable signal 224, a write assist enable signal 226, and a standard mode enable signal 228. In the example of FIG. 2, the enable signals 224, 226, and 228 are provide by mode control circuitry 216 within the processor 202. In other embodiments, the enable signals may be provided, all or separately, by other components.

Based on the retention enable signal 224, write assist enable signal 226, and standard mode enable signal 228, the switch circuit may selectively set the cell source voltage 232 for one or more of the memory cells of the cache 218 to one of: a retention voltage, a write assist voltage, or a standard mode voltage. In such an embodiment, the retention voltage and the write assist voltage are less than the standard mode voltage.

Figure 3:
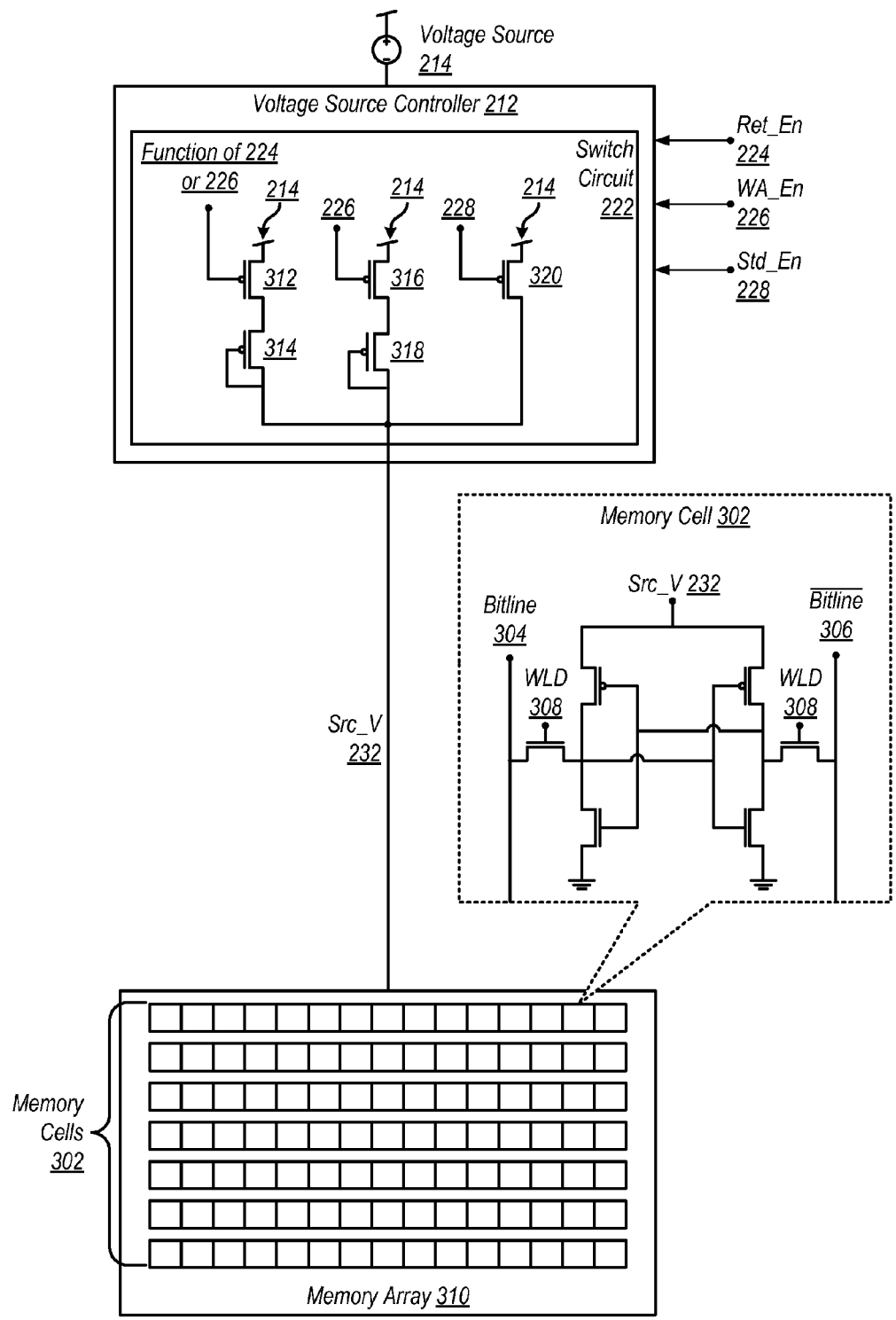
FIG. 3 sets forth a block diagram of an example voltage source controller for a memory array.

For further explanation, FIG. 3 sets forth a block diagram of an example voltage source controller for a memory array. The example voltage controller 312 of FIG. 3 an input coupled to a voltage source 214 and an output coupled to one or more memory cells 302 of a memory array 310. The output is configured to provide a cell source voltage 232 to the memory cells 302.

The example of FIG. 3 also sets forth an expanded view of an example memory cell 302 which may be included in the memory 310. The memory cell 302 is may be implemented as a traditional '6T', or six transistor, memory cell which includes two NFETs enabled by a word line driver 308 and coupling complementary bitlines 304, 306 to the storage transistors. The storage transistors include two PFETs and two NFETs, cross-coupled. The PFETs receive the cell source voltage 232 provided by the voltage source controller.

The cell source voltage 232 is controlled by the example voltage controller through operation of a switch circuit 222. The switch circuit is configured to receive a retention enable signal 224, a write assist enable signal 226, and a standard mode enable signal 228. Based on the retention enable signal 224, write assist enable signal 226, and standard mode enable signal 228, the switch circuit selectively sets the cell source voltage 232 for one or more of the memory cells to one of: a retention voltage, a write assist voltage, or a standard mode voltage. The retention voltage and the write assist voltage are less than the standard mode voltage.

The example switch circuit 222 of FIG. 3 includes a first leg, second leg, and third leg in parallel. The first leg in the example switch circuit 222 of FIG. 2 includes a first PFET 312 and a second PFET 314. The first PFET 312 is configured to couple the voltage source 214 to the second PFET 314 upon receiving the retention enable signal 224 or the write assist enable signal 226. The second PFET 314 is configured to reduce the voltage received from the first PFET 312 and to provide the reduced voltage as the cell source voltage 232.

The second leg includes a first PFET 316 and a second PFET 318. The first PFET 316 is configured to couple the voltage source 214 to the second PFET 318 upon receiving the write assist enable signal 226. The second PFET 318 is configured to reduce the voltage received from the first PFET 316 and to provide the reduced voltage as the cell source voltage 232. It is noted that when the write assist enable signal is received, the first and second leg are active concurrently. By contrast, when only the retention enable signal 224 is received, only the first leg is active.

The third leg includes a PFET 320 configured to receive the standard mode enable signal 228 and provide, as the cell source voltage, the voltage source 214. That is, the third leg effectively provides a bypass for normal operating voltage.

Figure 4:
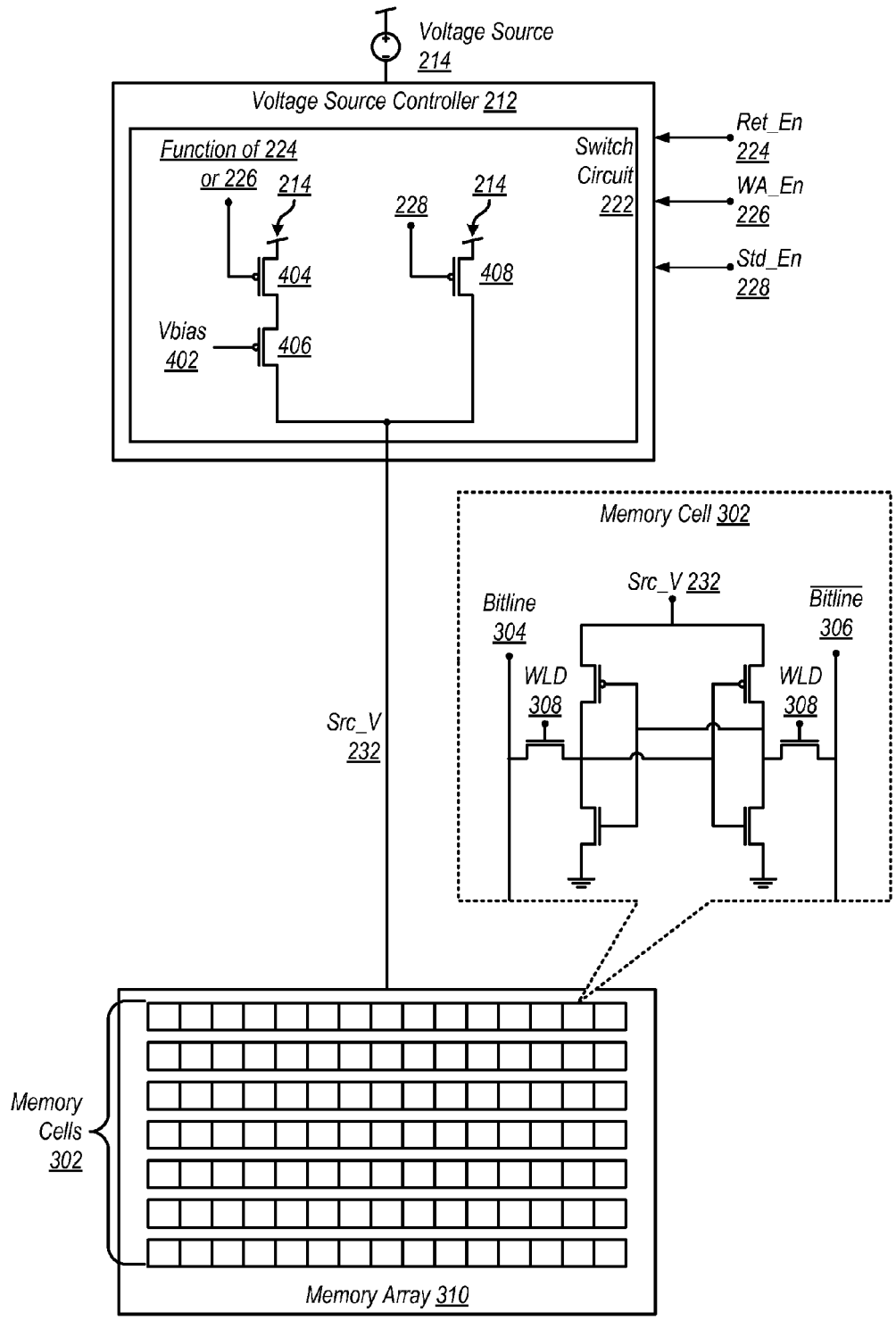
FIG. 4 sets forth a block diagram of another example voltage source controller for a memory array.

For further explanation, FIG. 4 sets forth a block diagram of another example voltage source controller for a memory array. The example voltage source controller 212 of FIG. 4 is similar to the example voltage source controller 212 of FIG. 3 in that voltage source controller 212 of FIG. 4 includes an input coupled to a voltage source 214, an output coupled to one or more memory cells 302 of a memory array 310, and a switch circuit 222 configured to selectively set the cell source voltage 232 for one or more of the memory cells to one of: a retention voltage, a write assist voltage, or a standard mode voltage base on the retention enable signal 224, write assist enable signal 226, and standard mode enable signal 228.

The example voltage source controller 212 of FIG. 4 differs from the voltage source controller 212 of FIG. 3, however, in that switch circuit 222 of the voltage source controller 212 includes only two legs. The first leg includes a first PFET 404 and a second PFET 406. The first PFET 404 is configured to couple the voltage source 214 to the second PFET 406 upon receiving the retention enable signal 224 or the write assist enable signal 226. The second PFET 406 is configured to reduce the voltage received from the first PFET 404 based on a bias voltage 402 received by the second PFET and to provide the reduced voltage as the cell source voltage 232. The bias voltage 402 may be a controllable (that is, variable)

voltage. Such variations of the bias voltage 402 may be configured to vary the impedance of the second PFET 406 and thus control the voltage drop across the PFET 406.

The second leg includes a PFET 408 configured to receive the standard mode enable signal and provide, as the cell source voltage, the voltage source.

Figure 5:
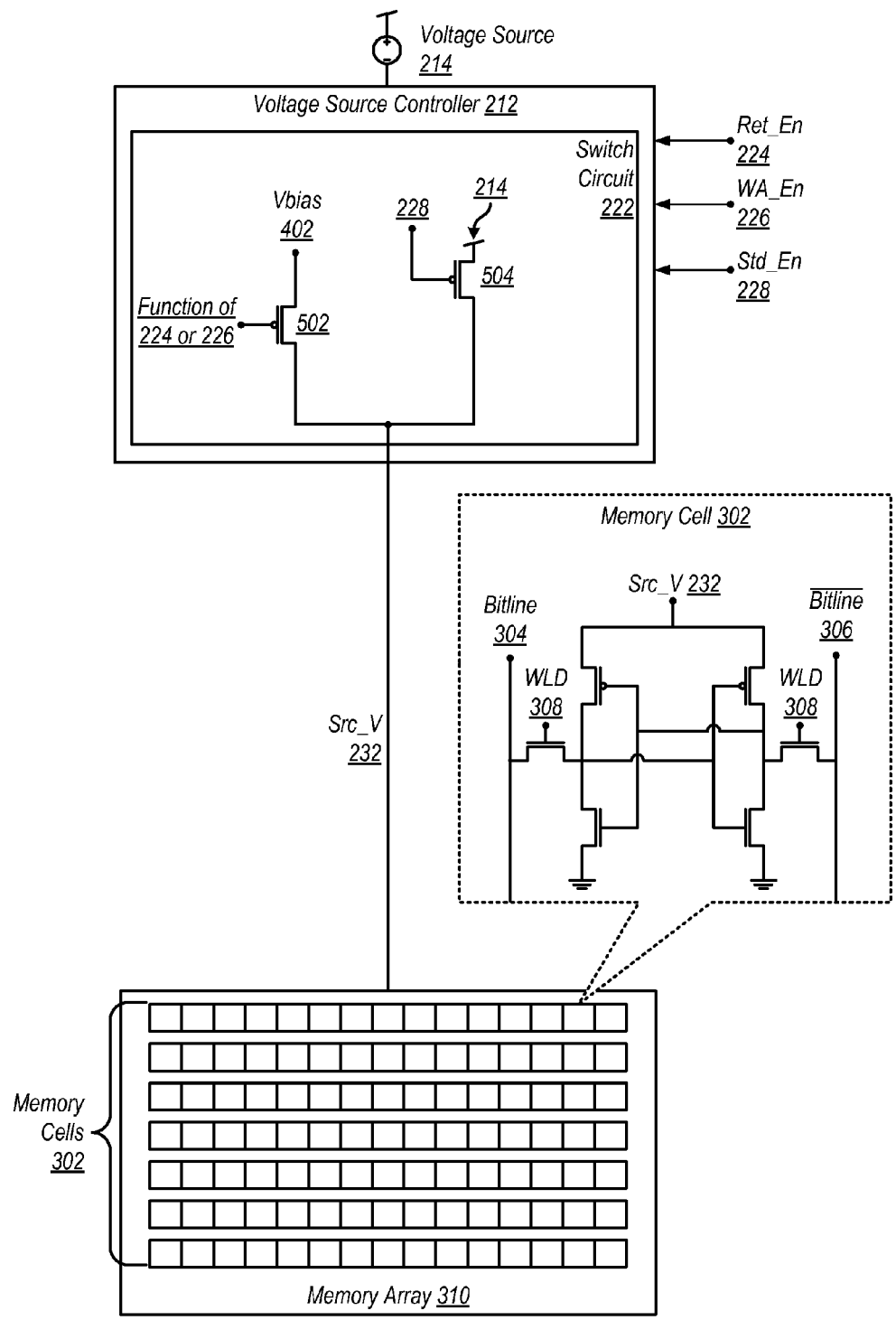
FIG. 5 sets forth a block diagram of another example voltage source controller for a memory array.

For further explanation, FIG. 5 sets forth a block diagram of yet another example voltage source controller for a memory array. The example voltage source controller 212 of FIG. 5 is similar to the example voltage source controller 212 of FIG. 3 in that voltage source controller 212 of FIG. 5 includes an input coupled to a voltage source 214, an output coupled to one or more memory cells 302 of a memory array 310, and a switch circuit 222 configured to selectively set the cell source voltage 232 for one or more of the memory cells to one of: a retention voltage, a write assist voltage, or a standard mode voltage base on the retention enable signal 224, write assist enable signal 226, and standard mode enable signal 228.

The example voltage source controller 212 of FIG. 4 differs from the voltage source controller 212 of FIG. 3, however, in that switch circuit 222 of the voltage source controller 212 includes only two legs. The first leg includes a PFET 502 configured to provide, as the cell source voltage 232, a bias voltage 402 upon receiving the retention enable signal 224 or the write assist enable signal 226. As mentioned above, and as will be described below in greater detail, the bias voltage 402 may be controllably varied. As such, the bias voltage may be set to one voltage when the retention enable signal 224 is received by the switch circuit 222 and set to another, different voltage when the write assist enable signal 226 is received.

The second leg of the example switch circuit 222 of FIG. 5 includes a PFET 504 configured to provide, as the cell source voltage 232, the voltage source upon receiving the standard mode enable signal 228.

As mentioned above, the bias voltage 402 described in FIG. 4 and FIG. 5 may be controllably varied. In some embodiments, the bias voltage 402 may be controlled and provided by a voltage regulator. In other embodiments the bias voltage 402 may be controlled and is provided by a module of active circuitry, such as one or transistors. In yet another embodiment the bias voltage 402 may be controlled and provided by a resistive divider circuit. For further explanation, therefore, FIG. 6 sets forth a circuit diagram of an example bias voltage generation circuit 600 that includes a resistive divider circuit.

Figure 6:
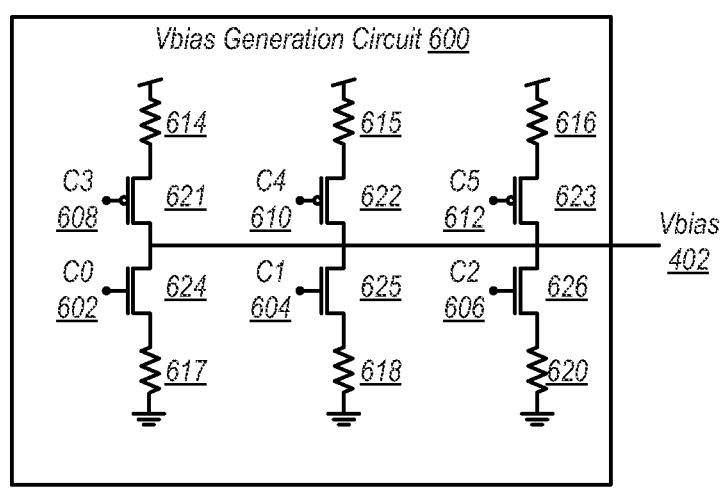
FIG. 6 sets forth a circuit diagram of an example bias voltage generation circuit for use with a voltage source controller as described in FIG. 4 and FIG. 5.

The example bias voltage generation circuit 600 of FIG. 6 may include several resistors 614-620, several PFETs 621-623, and several NFETs 624-626. The resistors may be of the same value or may be of different values. Each PFET and NFET may be selectively enabled based on a control signal 602, 604, 606, 608, 610, and 612. In the example bias voltage generation circuit of FIG. 6, the control signals may selectively provided so as to enable and disable different sets of the PFETs and NFETs. By enabling and disabling different sets of the PFETs and NFETs, the circuit forms various different sets of resistor voltage dividers. Different sets of resistor voltage dividers may provide different voltage drops and thus a different bias voltage 402.

It is noted that the bias voltage generation circuit 600 of FIG. 6 may be included as a component of the voltage controller or as a separate component.

Figure 7:
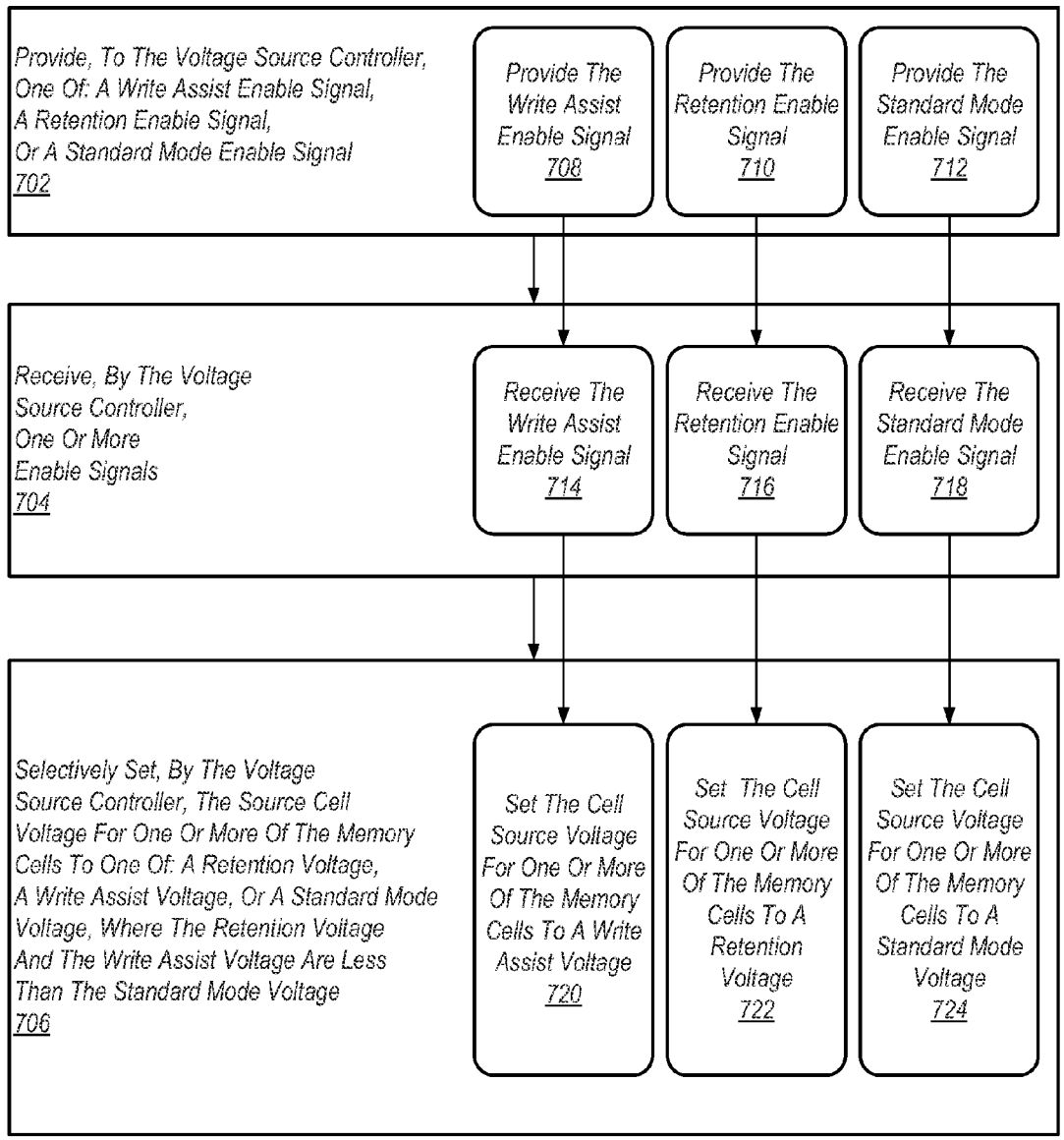
FIG. 7 sets forth a flowchart illustrating an example method of operating a memory array with a voltage source controller.

For further explanation, FIG. 7 sets forth a flowchart illustrating an example method of operating a memory array with a voltage source controller, such as the example voltage source controllers 212 set forth in FIG. 3, FIG. 4, FIG. 5, and FIG. 6. The memory array includes a number of memory cells, where one or more of the memory cells are configured to receive a source cell voltage from the voltage source controller. The method of FIG. 7 providing 702, to the voltage source controller, one of: a write assist enable signal, a retention enable signal, or a standard mode enable signal. That is, providing 702 the enable signals may include one of providing 708 the write assist enable signal, providing 710 the retention enable signal, or providing 712 the standard mode enable signal. Such enable signals may be provided by various different components or a single component, such as the mode control circuitry 216 described in FIG. 2.

The method of FIG. 7 also includes receiving 704, by the voltage source controller, the one or more enable signals. When the write assist enable signal is provided 708, the voltage source controller receives 714 the write assist enable signal. When the retention enable signal is provided 710, the voltage source controller receives 716 the retention enable signal. When the standard mode enable signal is provided 712, the voltage source controller receives 718 the standard mode enable signal.

Responsive to receiving the one or more enable signals, the method of FIG. 7 includes selectively setting 706, by the voltage source controller, the source cell voltage for one or more of the memory cells to one of: a retention voltage 720, a write assist voltage 722, or a standard mode voltage 724. In the method of FIG. 7, the retention voltage and the write assist voltage are less than the standard mode voltage. Setting 706 the source cell voltage to a retention voltage, write assist voltage, or standard mode voltage may be carried out as discussed above with respect to switch circuit 222 operation in FIG. 3, FIG. 4, and FIG. 5.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A voltage source controller for a memory array, the voltage source controller comprising:
   an input coupled to a voltage source;
   an output coupled to one or more memory cells of a memory array, the output configured to provide a cell source voltage to the memory cells; and
   a switch circuit configured to:
   receive a retention enable signal, a write assist enable signal, and a standard mode enable signal; and
   based on the retention enable signal, write assist enable signal, and standard mode enable signal, selectively set the cell source voltage for one or more of the memory cells to one of: a retention voltage, a write assist voltage, or a standard mode voltage, wherein the retention voltage and the write assist voltage are less than the standard mode voltage.

2. The voltage source controller of claim 1, wherein:
   the switch circuit further comprises a first leg, second leg, and third leg in parallel;
   the first leg comprises a first PFET and a second PFET, wherein the first PFET is configured to couple the voltage source to the second PFET upon receiving the retention enable signal or the write assist enable signal and the second PFET is configured to reduce the voltage received from the first PFET and to provide the reduced voltage as the cell source voltage;
   the second leg comprises a first PFET and a second PFET, wherein the first PFET is configured to couple the voltage source to the second PFET upon receiving the write assist enable signal and the second PFET is configured to reduce the voltage received from the first PFET and to provide the reduced voltage as the cell source voltage; and the third leg comprises a PFET configured to receive the standard mode enable signal and provide, as the cell source voltage, the voltage source.

3. The voltage source controller of claim 1, wherein:
the switch circuit further comprises a first leg and a second leg in parallel;
the first leg comprises a first PFET and a second PFET, wherein the first PFET is configured to couple the voltage source to the second PFET upon receiving the retention enable signal or the write assist enable signal and the second PFET is configured to reduce the voltage received from the first PFET based on a bias voltage received by the second PFET and to provide the reduced voltage as the cell source voltage; and
the second leg comprises a PFET configured to receive the standard mode enable signal and provide, as the cell source voltage, the voltage source.

4. The voltage source controller of claim 3, wherein the bias voltage is controllably variable and is provided by a voltage regulator.

5. The voltage source controller of claim 3, wherein the bias voltage is controllably variable and is provided by a module of active circuitry.

6. The voltage source controller of claim 3, wherein the bias voltage is controllably variable and is provided by a resistive divider circuit.

7. The voltage source controller of claim 1, wherein the switch circuit further comprises:
a first leg comprising a PFET configured to provide, as the cell source voltage, a bias voltage upon receiving the retention enable signal or the write assist enable signal; and
a second leg comprising a PFET configured to provide, as the cell source voltage, the voltage source upon receiving the standard mode enable signal.

8. The voltage source controller of claim 7, wherein the bias voltage is variable and is provided by a voltage regulator.

9. The voltage source controller of claim 7, wherein the bias voltage is variable and is provided by a module of active circuitry.

10. The voltage source controller of claim 7, wherein the bias voltage is variable and is provided by a resistive divider circuit.

11. A device comprising, comprising:
a memory array and a voltage source controller, wherein the memory array comprises a plurality of memory cells and one or more of the memory cells are configured to receive a cell source voltage from the voltage source controller; and
wherein the voltage source controller comprises an input coupled to a voltage source, an output configured to provide the cell source voltage to the memory cells, and a switch circuit configured to:
receive a retention enable signal, a write assist enable signal, and a standard mode enable signal; and
based on the retention enable signal, write assist enable signal, and standard mode enable signal, selectively set the cell source voltage for one or more of the memory cells to one of: a retention voltage, a write assist voltage, or a standard mode voltage, wherein the retention voltage and the write assist voltage are less than the standard mode voltage.

12. The device of claim 11, wherein the device comprises a mobile device.

13. The device of claim 11, wherein the memory array comprises Static Random Access Memory ('SRAM').

14. The device of claim 11, wherein:
the switch circuit further comprises a first leg, second leg, and third leg in parallel;
the first leg comprises a first PFET and a second PFET, wherein the first PFET is configured to couple the voltage source to the second PFET upon receiving the retention enable signal or the write assist enable signal and the second PFET is configured to reduce the voltage received from the first PFET and to provide the reduced voltage as the cell source voltage;
the second leg comprises a first PFET and a second PFET, wherein the first PFET is configured to couple the voltage source to the second PFET upon receiving the write assist enable signal and the second PFET is configured to reduce the voltage received from the first PFET and to provide the reduced voltage as the cell source voltage; and
the third leg comprises a PFET configured to receive the standard mode enable signal and provide, as the cell source voltage, the voltage source.

15. The device of claim 11, wherein:
the switch circuit further comprises a first leg and a second leg in parallel;
the first leg comprises a first PFET and a second PFET, wherein the first PFET is configured to couple the voltage source to the second PFET upon receiving the retention enable signal or the write assist enable signal and the second PFET is configured to reduce the voltage received from the first PFET based on a bias voltage received by the second PFET and to provide the reduced voltage as the cell source voltage; and
the second leg comprises a PFET configured to receive the standard mode enable signal and provide, as the cell source voltage, the voltage source.

16. The device of claim 11, wherein the switch circuit further comprises:
a first leg comprising a PFET configured to provide, as the cell source voltage, a bias voltage upon receiving the retention enable signal or the write assist enable signal; and
a second leg comprising a PFET configured to provide, as the cell source voltage, the voltage source upon receiving the standard mode enable signal.

17. A processor comprising:
a cache memory including a plurality of memory cells; and
a voltage source controller, wherein one or more of the memory cells are configured to receive a cell source voltage from the voltage source controller; and
wherein the voltage source controller comprises an input coupled to a voltage source, an output configured to provide the cell source voltage to the memory cells, and a switch circuit configured to:
receive a retention enable signal, a write assist enable signal, and a standard mode enable signal; and
based on the retention enable signal, write assist enable signal, and standard mode enable signal, selectively set the cell source voltage for one or more of the memory cells to one of: a retention voltage, a write assist voltage, or a standard mode voltage, wherein the retention voltage and the write assist voltage are less than the standard mode voltage.

18. The processor of claim 17, wherein the cache memory comprises Static Random Access Memory ('SRAM').

19. A method of operating a memory array, the memory array comprising a plurality of memory cells, wherein one or more of the memory cells are configured to receive a source cell voltage from a voltage source controller, the method comprising:
- receiving, by the voltage source controller, one or more enable signals;
- responsive to receiving the one or more enable signals, selectively setting, by the voltage source controller, the source cell voltage for one or more of the memory cells to one of: a retention voltage, a write assist voltage, or a standard mode voltage, wherein the retention voltage and the write assist voltage are less than the standard mode voltage.

20. The method of claim 19, wherein the voltage source controller comprises:
- an input coupled to a voltage source;
- an output coupled to one or more memory cells of a memory array, the output configured to provide the cell source voltage to the memory cells; and
- a switch circuit configured to:
- receive the retention enable signal, the write assist enable signal, and the standard mode enable signal; and
- based on the retention enable signal, write assist enable signal, and standard mode enable signal, selectively set the cell source voltage for one or more of the memory cells to one of: a retention voltage, a write assist voltage, or a standard mode voltage, wherein the retention voltage and the write assist voltage are less than the standard mode voltage.

21. The method of claim 20, wherein:
- the switch circuit further comprises a first leg, second leg, and third leg in parallel;
- the first leg comprises a first PFET and a second PFET, wherein the first PFET is configured to couple the voltage source to the second PFET upon receiving the retention enable signal or the write assist enable signal and the second PFET is configured to reduce the voltage received from the first PFET and to provide the reduced voltage as the cell source voltage;
- the second leg comprises a first PFET and a second PFET, wherein the first PFET is configured to couple the voltage source to the second PFET upon receiving the write assist enable signal and the second PFET is configured to reduce the voltage received from the first PFET and to provide the reduced voltage as the cell source voltage; and
- the third leg comprises a PFET configured to receive the standard mode enable signal and provide, as the cell source voltage, the voltage source.

22. The method of claim 20, wherein:
- the switch circuit further comprises a first leg and a second leg in parallel;
- the first leg comprises a first PFET and a second PFET, wherein the first PFET is configured to couple the voltage source to the second PFET upon receiving the retention enable signal or the write assist enable signal and the second PFET is configured to reduce the voltage received from the first PFET based on a bias voltage received by the second PFET and to provide the reduced voltage as the cell source voltage; and
- the second leg comprises a PFET configured to receive the standard mode enable signal and provide, as the cell source voltage, the voltage source.

23. The method of claim 20, wherein the switch circuit further comprises:
- a first leg comprising a PFET configured to provide, as the cell source voltage, a bias voltage upon receiving the retention enable signal or the write assist enable signal; and
- a second leg comprising a PFET configured to provide, as the cell source voltage, the voltage source upon receiving the standard mode enable signal.

24. The method of claim 20, wherein the bias voltage is controllably variable.

25. A method of operating a memory array, the memory array comprising a plurality of memory cells, wherein one or more of the memory cells receives a cell source voltage from a voltage source controller, the method comprising:
- providing, to the voltage source controller, one of: a write assist enable signal, a retention enable signal, or a standard mode enable signal, wherein:
  - providing the write assist enable signal causes the voltage source controller to set the cell source voltage for one or more of the memory cells to a write assist voltage;
  - providing the retention enable signal causes the voltage source controller to set the cell source voltage for one or more of the memory cells to a retention voltage;
  - providing the standard mode enable signal causes the voltage source controller to set the cell source voltage for one or more of the memory cells to a standard mode voltage; and
  - the retention voltage and the write assist voltage are less than the standard mode voltage.

* * * * *